(12) United States Patent
Ishii

(10) Patent No.: US 6,754,949 B2
(45) Date of Patent: Jun. 29, 2004

(54) METHOD AND APPARATUS FOR MANUFACTURING ELECTRONIC PARTS

(75) Inventor: Mitoshi Ishii, Ohita (JP)

(73) Assignee: Ishii Tool & Engineering Corporation, Ohita (JP)

( * ) Notice: Subject to any disclaimer, the term of this patent is extended or adjusted under 35 U.S.C. 154(b) by 0 days.

(21) Appl. No.: 10/642,261

(22) Filed: Aug. 18, 2003

(65) Prior Publication Data

US 2004/0031136 A1 Feb. 19, 2004

Related U.S. Application Data (62) Division of application No. 09/956,147, filed on Sep. 20, 2001, now Pat. No. 6,671,940.

(30) Foreign Application Priority Data

Sep. 22, 2000 (JP) .......................... 2000-289615

(51) Int. Cl.[7] .......................... B21B 15/00; B23P 19/00; B26D 3/00

(52) U.S. Cl. .......................... 29/739; 29/742; 29/743; 29/833; 29/33 M; 83/929.1; 83/915.3

(58) Field of Search .......................... 29/33 M, 33 K, 29/563, 564, 564.1, 564.2, 564.7, 739, 742, 743, 762, 412, 417, 833; 83/929.1, 915.3, 404.1

(56) References Cited

U.S. PATENT DOCUMENTS

| | | | | | |
|---|---|---|---|---|---|
| 766,111 | A | * | 7/1904 | Mowery | 83/915.3 |
| 2,280,049 | A | * | 4/1942 | Turner et al. | 83/915.3 |
| 4,648,298 | A | * | 3/1987 | Sutton | 83/929.1 |
| 4,846,032 | A | * | 7/1989 | Jampathom et al. | 83/929.1 |
| 4,985,982 | A | * | 1/1991 | Lohr et al. | 29/566.1 |
| 5,335,702 | A | * | 8/1994 | Goto | 29/741 |
| 6,053,084 | A | * | 4/2000 | Pawlenko | 29/846 |
| 6,205,656 | B1 | * | 3/2001 | Adams et al. | 29/564.1 |
| 6,291,317 | B1 | * | 9/2001 | Salatino et al. | 83/929.1 |

* cited by examiner

*Primary Examiner*—Dana Ross
(74) *Attorney, Agent, or Firm*—Westerman, Hattori, Daniels & Adrian, LLP (57) ABSTRACT

The object of the present invention is to form individual packaged ICs by using a single apparatus to cut wiring boards on which a plurality of IC chips are mounted. The first cutting device 23 cuts the wiring boards 3 into separate parts along one direction, so that the cut wiring boards 3 constitute strip-form cut wiring boards 3a. The cut wiring boards 3a are conveyed to the second cutting device 33, and are fed by the second conveying device 43 along the direction of length and are then cut by the second cutting device 33 with the orientation altered by 90 degrees relative to the first cutting direction. The wiring boards 3b resulting from the cutting performed by the second cutting device 33 constitute the original forms of the IC packages. The wiring boards 3b that have been cut and conveyed from the second cutting device 33 enter a cleaning step.

7 Claims, 10 Drawing Sheets

METHOD AND APPARATUS FOR MANUFACTURING ELECTRONIC PARTS

This application is a divisional application of prior application Ser. No. 09/956,147 filed Sep. 20, 2001 U.S. Pat. No. 6,671,940.

BACKGROUND OF THE INVENTION

1. Field of the Invention

The present invention relates to a method and apparatus for manufacturing electronic parts. More particularly, the present invention relates to a method and apparatus for manufacturing electronic parts in which wiring boards on which a plurality of IC chips are mounted and which are packaged by means of a synthetic resin are cut in order to cut these boards into individual IC packages.

2. Description of the Related Art

As semiconductors have become more highly integrated, packages in which the leads are disposed on the undersurface of the package as in a BGA (ball grid array) or the like have begun to be used. The manufacture of individual IC packages by the cutting of a wiring board on which IC chips sealed with a synthetic resin are mounted is known. Various methods have been proposed as methods for cutting IC chips packaged in a synthetic resin into individual IC packages. The separation of IC packages on which IC chips are mounted by cutting using a diamond saw (which is a cutting grindstone using a diamond blade) or the like is one example of such a method.

Furthermore, prior to the dicing of semiconductor substrates, measures such as coating of the back surfaces of the semiconductor substrates with a polyimide and bonding to a dicing tape or the like are performed. Moreover, cutting in a cross pattern using the same cutting device with the orientation of the table on which the semiconductor substrates are carried being varied is also known as a separation method. Furthermore, in such separation processes, tape bonding is performed prior to cutting, and cleaning using a cleaning liquid is performed following cutting in order to remove adhering cutting debris.

However, conventional separation methods involve various problems, and it has not always been possible to increase the production efficiency. In regard to tape bonding, the following problem has been encountered: specifically, in cases where cutting is performed with the tape in a bonded state, the grindstone may become clogged during cutting so that operation becomes impossible, thus resulting in defective products.

Furthermore, since cleaning following cutting is performed using wash water, there is a danger of the dissolution of heavy metals, so that a special waste water treatment must be performed in order to avoid environmental problems; as a result, the cost of the product is increased. Since water is used for cleaning, this water invades fine cracks and peeled areas in stacked parts, and remains in these areas. As a result, there is a danger that these parts will become corroded, or that current leakage will occur so that a defective product is produced.

The abovementioned cutting is performed by the same cutting device while indexing the table on which the member that is being cut, such as a wiring board or the like, is carried, and varying the direction so that cutting is performed again in a different direction. Simultaneous cutting in two directions cannot be performed using a single working apparatus. Furthermore, in the case of mass production, a line is constructed, and the work is divided into a plurality of processes. However, this results in the use of lines that are used exclusively for specified products that are being worked, so that such a method lacks flexibility; furthermore, such a process is expensive and requires a large amount of space for the equipment.

Especially in cases where there is a change in the member that is being cut, such as a wiring board or the like, expensive jigs and tools must be changed; furthermore, a degree of experience in the working process is also required, and time is required for such replacements. Also in cases where the finished products are recovered and accommodated, conventional methods involve a process in which the solder ball parts, which consist of metallic solder and which are connected to printed circuit boards, are caused to face the cutting tool during cutting. In other words, cutting is ordinarily performed with the solder ball parts facing upward. Accordingly, after cutting or when the products are recovered, the products are again inverted and accommodated in a case with the solder ball parts facing downward. Consequently, time is also required for this accommodation of the products.

SUMMARY OF THE INVENTION

The present invention was devised on the basis of such a technical background, and achieves the following objects.

One object of the present invention is to provide a method and apparatus for manufacturing electronic parts which are devised so that different wiring boards can be simultaneously cut by a plurality of cutting devices, thus improving the manufacturing efficiency in economic terms.

A further object of the present invention is to provide a method and apparatus for manufacturing electronic parts which are devised so that dust generated in the cutting step is captured in order to protect the electronic parts during cutting, thus improving the quality of the electronic parts.

A further object of the present invention is to provide a method and apparatus for manufacturing electronic parts in which the positions of the conveyed wiring boards are accurately recognized so that cutting is performed in accurate cutting positions, thus increasing the cutting efficiency.

A further object of the present invention is to provide a method and apparatus for manufacturing electronic parts which are devised so that the electronic parts that have been cut are cleaned and inverted in the product accommodating step, thus allowing efficient product accommodation in a short period of time.

The present invention adopts the following means in order to achieve the abovementioned objects.

The method of the present invention for manufacturing electronic parts comprises a conveying step wherein plate-form electronic parts sealed in resin are conveyed, a first fastening step wherein said conveyed plate-form electronic parts are positioned and fastened in place, a first cutting step wherein said plate-form electronic parts that have been positioned and fastened in place in said first fastening step are moved in one direction on the plane including said electronic parts, and are cut, a second fastening step wherein strip-form electronic parts that have been cut in said first cutting step are conveyed, positioned and fastened in place, a second cutting step wherein the strip-form electronic parts that have been conveyed, positioned and fastened in place in said second fastening step are moved in a direction that crosses the abovementioned cutting direction, and are cut, and a product accommodating step wherein single electronic parts that have been cut in said second cutting step are accommodated.

Furthermore, said first fastening step and said second fastening step may include an optical recognition step wherein the positions of said plate-form electronic parts or said strip-form electronic parts that are conveyed are optically recognized.

Furthermore, said first fastening step and said second fastening step may be press-fastening steps wherein said plate-form electronic parts or said strip-form electronic parts are fastened in place by the application of pressure from above after said electronic parts have been placed on a carrying table.

Furthermore, said first cutting step and second cutting step may be steps wherein cutting is performed by causing a rotary grindstone to move.

Furthermore, said first cutting step and second cutting step may include a step wherein dust or the like generated by cutting is removed by suction.

Furthermore, said product accommodating step may include a step wherein said single electronic parts cut in said second cutting step are clamped and inverted, and the orientation of said electronic parts is altered.

Furthermore, said product accommodating step may include a step wherein said clamped single electronic parts are brushed.

The apparatus of the present invention for manufacturing electronic parts comprises a conveying body which is used to convey the electronic parts, a first fastening device which positions and fastens plate-form electronic parts sealed in resin that are conveyed by said conveying body, a first cutting device which moves said electronic parts that have been positioned and fastened in place by said first fastening device in one direction on the plane including said electronic parts, and cuts said electronic parts, a second fastening device which conveys, positions and fastens strip-form electronic parts that have been cut by said first cutting device, a second cutting device which moves said strip-form electronic parts that have been conveyed, positioned and fastened in place by said second fastening device in a direction that crosses the abovementioned cutting direction, and which cuts said electronic parts, and a product accommodating device which accommodates the single electronic parts that have been cut by said second cutting device.

Furthermore, the first fastening device and said second fastening device may contain a position recognition device which optically recognizes the positions of said plate-form electronic parts or said strip-form electronic parts that have been conveyed.

Furthermore, the device that optically recognizes the positions of said plate-form electronic parts or said strip-form electronic parts may be a device which recognizes the shapes of said electronic parts by means of a CCD camera, and specifies the cutting positions.

Furthermore, the first fastening device and said second fastening device may be devices that fasten said conveyed plate-form electronic parts or said [conveyed] strip-form electronic parts by means of restraining members that apply pressure from above after said electronic parts have been placed on a carrying table.

Furthermore, said first fastening device and said second fastening device may be devices that have attached means fastening said plate-form electronic parts or said strip-form electronic parts by means of a vacuum suction force.

Furthermore, in said first fastening device and said second fastening device, projecting parts which are used to press said plate-form electronic parts or said strip-form electronic parts may be formed on said restraining member.

Furthermore, in the restraining members that fasten said plate-form electronic parts or said strip-form electronic parts after said electronic parts have been placed on a carrying table, cutting grooves which are used to allow the passage of a rotary tool in order to cut said plate-form electronic parts or said strip-form electronic parts may be formed in said carrying tables and restraining members.

Furthermore, said first cutting device and second cutting device may be equipped with dust collectors that use suction to capture the dust-form cutting debris that is generated by cutting.

Furthermore, said first cutting device and said second cutting device may be devices which have rotary cutting tools, and which perform advancing and retracting movements on two or more axes.

Furthermore, said rotary cutting tools may be tools that are formed as composite tools by the electrodeposition of diamond abrasive grains and CBN abrasive grains.

Furthermore, said product accommodating device may include a device which clamps said single electronic parts cut by said second cutting device, inverts said electronic parts and alters the orientation of said electronic parts.

Furthermore, said product accommodating device may include a device which brushes the clamped single electronic parts.

BRIEF DESCRIPTION OF THE DRAWINGS

FIG. 2(a) is a perspective view of the overall wiring board,

FIG. 2(b) is a partial enlarged view of FIG. 2(a), and

FIG. 2(c) is a partial enlarged view of FIG. 2(b);

FIG. 3(a) is a perspective view which shows the overall construction, and

FIG. 3(b) is an explanatory diagram which shows the respective devices contained in the apparatus in model form;

FIG. 17 shows the clamping members;

FIG. 18 shows the rotary tool;

DESCRIPTION OF THE PREFERRED EMBODIMENTS

[Embodiment 1]

Figure 1:
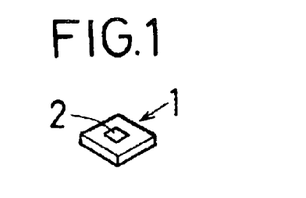
FIG. 1 is a perspective view which shows the product manufactured by the apparatus of the present invention.
Figure 2:
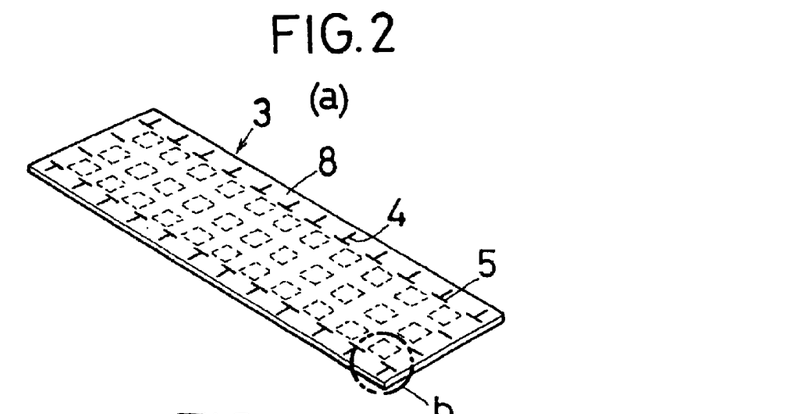
FIG. 2 shows the wiring board manufactured by the apparatus of the present invention.

Below, Embodiment 1 of the present invention will be described with reference to the attached figures. FIG. 1 shows an object IC chip which is cut by the cutting devices of the present invention; this figure shows a part which has been formed into a product by final cutting. FIG. 2 shows electronic parts before the parts have been cut; this figure shows a plate-form wiring board. FIG. 2(a) shows the overall shape of the wiring board, FIG. 2 (b) shows a partial enlarged view of FIG. 2(b), and FIG. 2(c) shows a partial enlarged view of FIG. 2(b). Details will be described below.

The product 1 shows the external appearance of the final product that is cut by the cutting devices of the present invention. This is generally called an IC package, and an IC chip 2 is built into the interior of this package. The wiring board 3 shows the state prior to cutting, in which a plurality of the products 1 are built into the wiring board prior to the separation of the products 1. The wiring board 3 is an aggregate on which a plurality of IC chips 2 are mounted; this is a board which is used to mount the IC chips, and is used for the electrical connection of electrical wires to solder balls 7 disposed on the undersurface of the wiring board 3.

The entire upper surface of the wiring board 3 is covered by a protective molding 8 made of a synthetic resin in order to protect the IC chips 2. Accordingly, the wiring board 3 referred to in the present embodiment constitutes an aggregate of so-called IC packages. IC packages are manufactured by being cut out of this wiring board 3 in units of IC chips 2. In recent years, high integration of IC chips 2 in such IC packages has progressed; as a result, there has been an accelerated increase in the size of IC packages.

However, the technology of IC packages themselves has also been developed with the aim of reducing the external size of the packages. An example of this is called a BGA (ball grid array), which is used in portable telephones and the like. In such a BGA, the size is reduced by achieving a narrow electrode pitch, i.e., a high electrode density, and leads are disposed on the undersurface of the IC package in the form of an area array.

The method and apparatus of the present embodiment for manufacturing electronic parts can be applied to the aforementioned BGA. This relates to a manufacturing technique in which such IC packages are cut from a wiring board 3, so that these packages are cut out as products 1 which constitute unit IC packages. Next, such IC packages will be described. The wiring board 3 is laminated by bonding together a plurality of sheets (three sheets in the present example) of a thin film 6 consisting of a thermosetting synthetic resin such as an epoxy type resin or the like.

Metal lead wires 10 consisting of copper or the like are wired so that these wires do not cross each other between the thin films 6; furthermore, wire connections are made so that the upper, middle and lower films, 6, 6a and 6b are stitched together. The IC chips 2 are bonded to the surface of this film 6 in a plurality of rows in the form of a lattice. Terminals of solder balls 7 which are connected to the IC chips 2 are disposed on the undersurfaces of the IC packages on which these IC chips are mounted.

These solder balls 7 have a hemispherical shape, and consist of a solder metal which is known to allow easy mounting on printed circuit boards and the like. Furthermore, the upper surfaces of the IC chips 2 (including the bonding wires 9) are covered by a protective molding 8 in order to protect the IC chips 2. This protective molding 8 is a thin sheet-form molding made of a thermosetting synthetic resin. The bonding wires 9, which are made of conductors, are connected from the IC chips 2.

The wiring board 3 is an aggregate consisting of a plurality of IC packages, and is formed with recesses between the IC packages. The wiring board 3 has an external appearance resembling that of a chocolate bar, and is a single plate-form part formed by laminating the films 6, 6a and 6b. Furthermore, first cutting position marks 4 and 5 which are used for recognition of the cutting positions by a recognition device (described later) are engraved or printed on this wiring board 3. Next, the apparatus of the present invention will be described in detail.

(Overall System of Manufacturing Apparatus)

Figure 3:
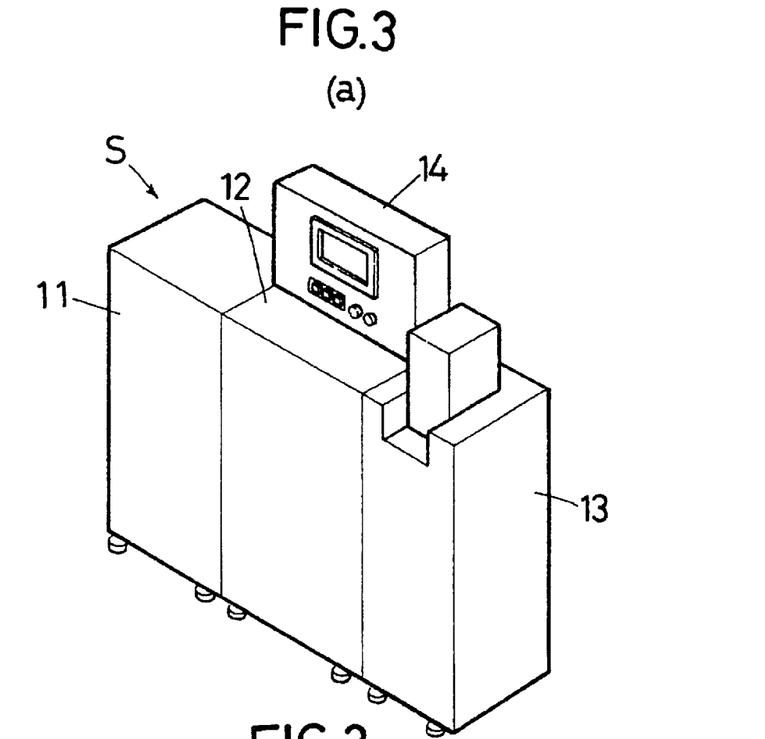
FIG. 3 shows an overall view of the apparatus of the present invention.
Figure 4:
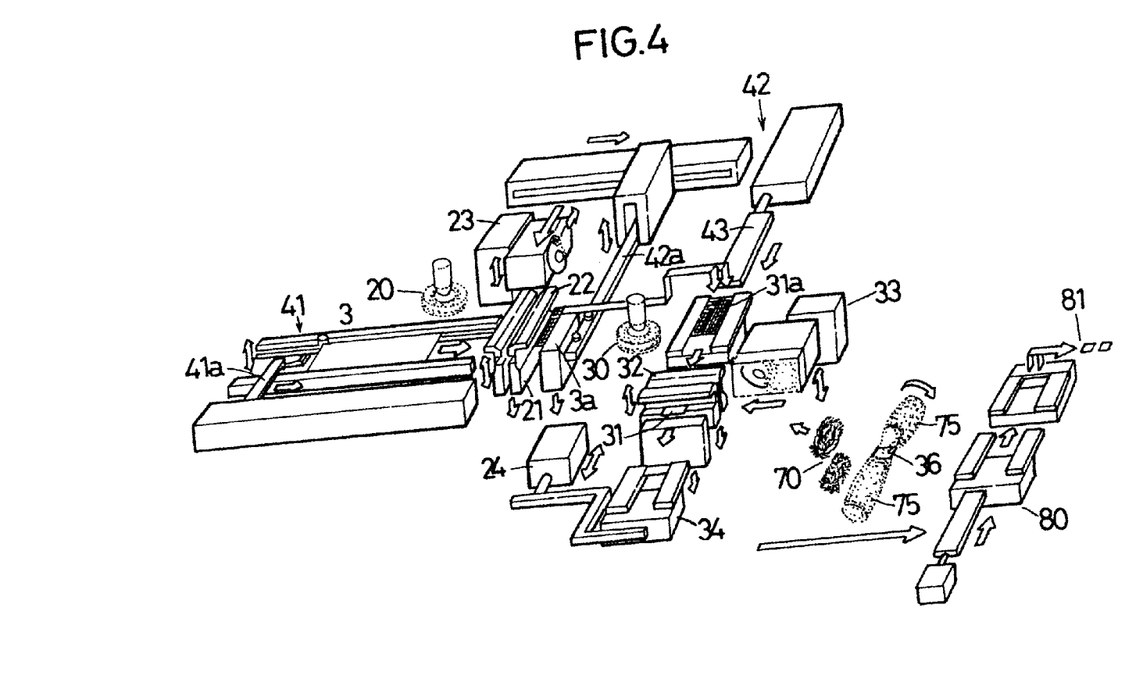
FIG. 4 is a skeleton diagram which shows the construction of the apparatus of the present invention.
Figure 5:
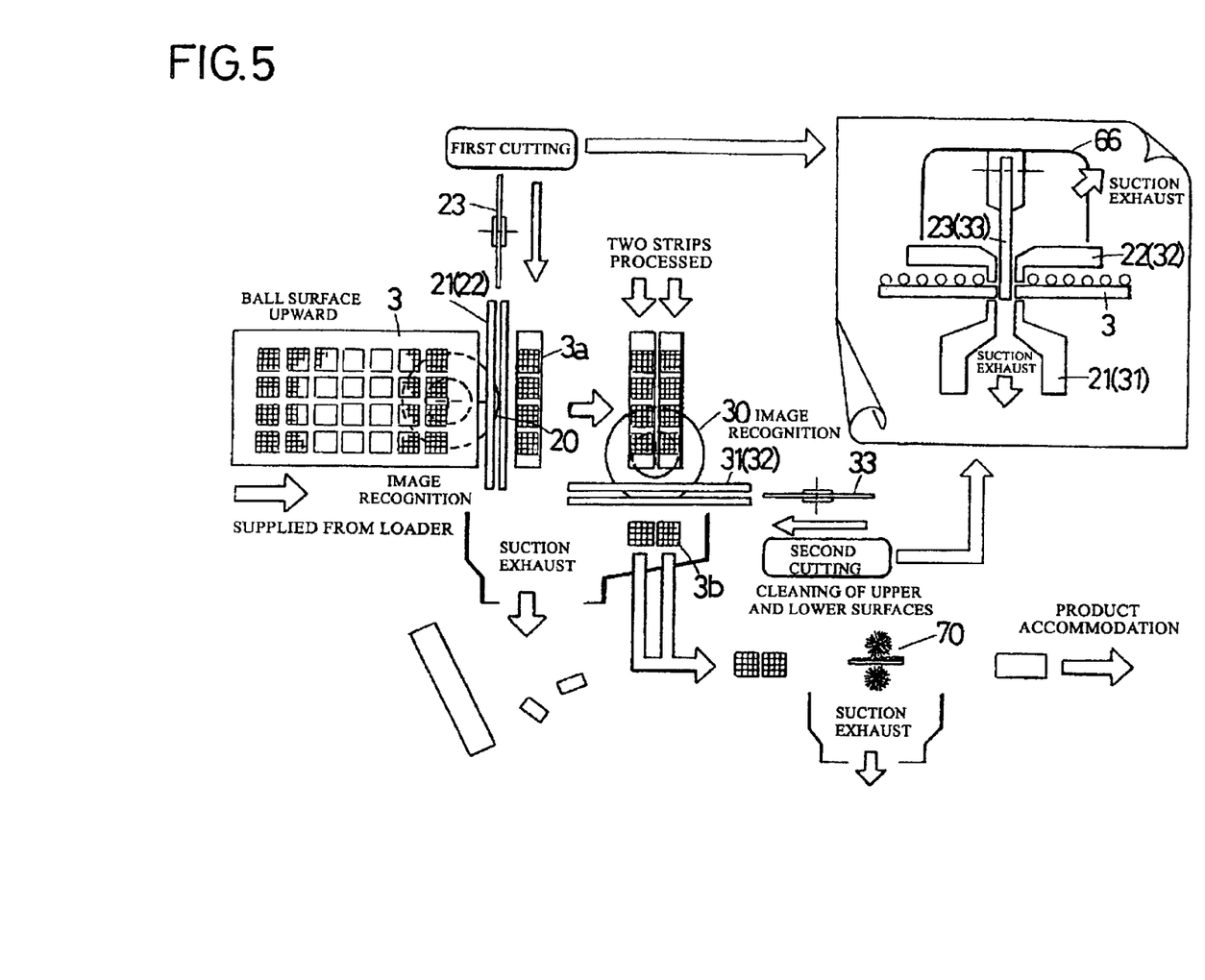
FIG. 5 is a process diagram which shows the manufacturing process of the electronic parts manufactured by the apparatus of the present invention.

FIG. 3 is an external view which shows the overall construction of the electronic part manufacturing apparatus S of the present embodiment of the invention in model form. FIG. 3(a) is an external view in which the respective devices are shown as boxes, and FIG. 3(b) is a diagram which shows the respective devices installed inside the apparatus in FIG. 3(a) in model form. FIG. 4 is an explanatory diagram which shows the overall construction of this electronic part manufacturing apparatus in skeleton form. FIG. 5 is an explanatory diagram which shows the manufacturing steps up to the point where the wiring board 3 is cut so that individual IC packages are formed.

In outline, the electronic part manufacturing apparatus S comprises a conveying part 11, a working part 12 and an accommodating part 13. The conveying part 11 is used to convey the wiring boards 3. The working part 12 includes a recognition device which is used to recognize the cutting positions of the wiring boards 3 that are to be cut, two fastening devices which are used to position and fasten the wiring boards 3, two cutting devices which are used to cut the wiring boards 3, a dust collector device which is used to capture the dust that is generated by cutting, and a cleaning device for the cut IC packages. The accommodating part 13 is used to accommodate the finished products.

In FIG. 3, the wiring boards 3 are conveyed from the left side of FIG. 3(b) via the conveying part 11. The central part in FIG. 3(b) is the working part 12; this working parts 12 has two constructions, and comprises a working part 12A which participates in the first cutting, and a working part 12B which participates in the second cutting.

A first CCD camera 20 and a second CCD camera 30, which are recognition devices whose positions and shapes will be described later, carrying tables 21 and 31 which carry the wiring boards, restraining members 22 and 32, a first cutting device 23 and second cutting device 33, dust collectors 24 and 34, and a rotary brush 25 or the like, are installed as respective devices involved in these cutting processes. Furthermore, a control device 14 which controls the operations of these respective devices is disposed on the upper part of the working part 12.

The accommodating part 13 which is disposed on the right side in terms of the orientation shown in FIG. 3(*b*) is constructed from a product feed-out device (see FIG. 4) 80 and a product accommodating box 81. Furthermore, dust collectors 24 and 34 which capture dust following cutting are disposed beneath the working part 12.

Next, the overall construction will be described in detail with reference to FIGS. 4 and 5. A first conveying device 41 is installed on the left end with respect to the orientation shown in FIGS. 4 and 5; this [conveying device 41] holds wiring boards 3 and conveys these wiring boards 3 toward the right. The first CCD camera 20, which is a recognition device, is installed near the conveying end, and is arranged so that this CCD camera 20 recognizes first cutting position marks 4 that are engraved in the wiring boards 3.

The first cutting device 23 is a device which is used to cut the wiring boards 3 into separate parts in one direction. The cut wiring boards 3 are thus formed into rectangular-form cut wiring boards 3a (see FIG. 5). Following cutting, these rectangular-form cut wiring boards 3a are shifted, and are conveyed to the second cutting device 33 by the second conveying device 42. In this case, the second cutting position marks 5 are recognized by the second CCD camera 30, which constitutes a second recognition device. The orientation of the second cutting device 33 is altered by 90 degrees relative to the orientation of the first cutting device 23, and this second cutting device 33 is disposed in the vicinity of the first cutting device 23 so that said second cutting device 33 can cut the cut wiring boards 3a.

The rectangular-form cut wiring boards 3a are transferred to the second cutting device 33 two boards at a time from the first cutting device 23 without any change in orientation by the first conveying device 41 and second conveying device 43. As is shown by the arrows in FIGS. 4 and 5, the second conveying device 42 moves vertically in the shifting direction and conveys the rectangular-form cut wiring boards 3a. The transferred cut wiring boards 3a have the form of long, slender strips, and are fed in by the second conveying device 43 along the direction of length. After the second cutting position marks 5 are recognized by the second CCD camera 30 at an intermediate point, and the rectangular-form cut wiring boards 3a are fastened in place, these rectangular-form cut wiring boards 3a are cut by the second cutting device 33 with the cutting direction altered by 90 degrees relative to the first cutting direction.

The wiring boards 3b, the single wiring boards 3b resulting from this cutting by the second cutting device 33 are the original forms of the IC packages. The wiring boards 3b that have been cut and conveyed from the second cutting device 33 enter a cleaning step, and are brushed by a rotary brush 25. When brushing is completed in the process of this cleaning, the wiring boards 3b are inverted and accommodated in the product accommodating part 81 as IC package products. In the present invention, a series of systematic operations is thus fully automated, and performed using a single apparatus.

[Control Device 14]

Figure 6:
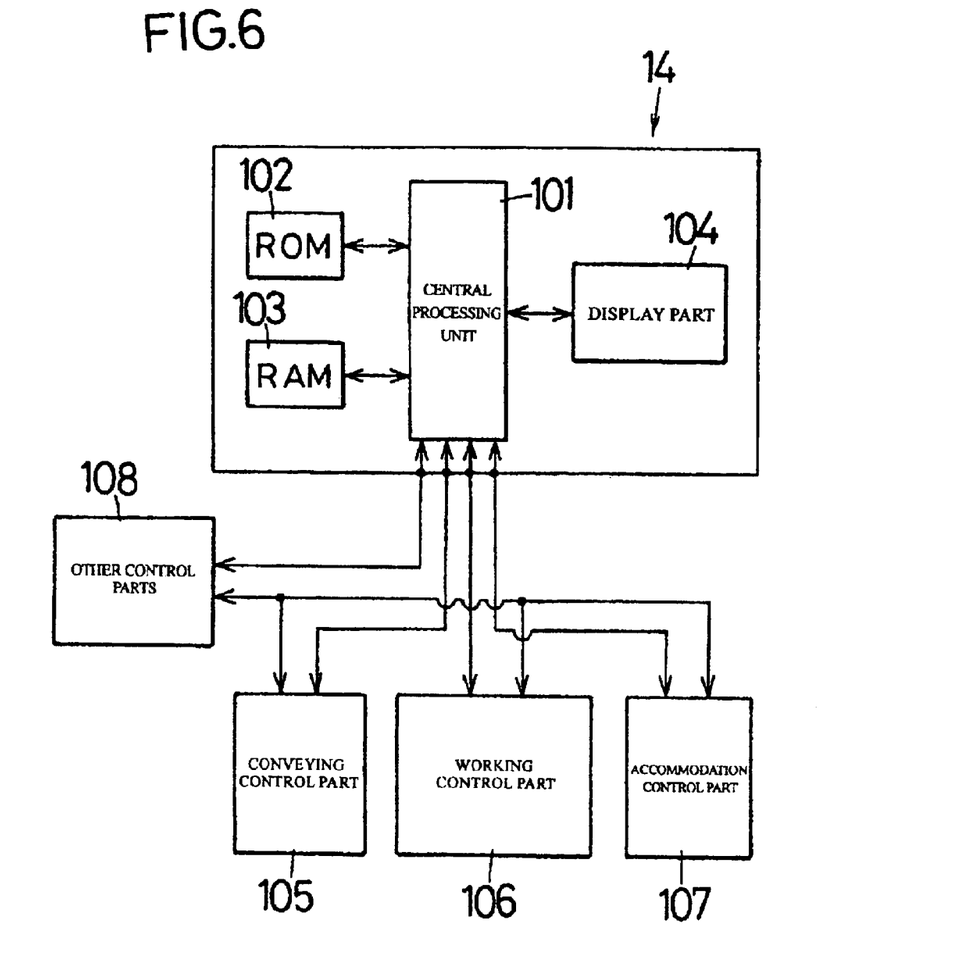
FIG. 6 is a block diagram which shows the control part of the apparatus of the present invention.

FIG. 6 is a block diagram which illustrates the system control of the cutting steps of the manufacturing apparatus S of the present invention. The control device 14 performs operational processing with respect to the three processes of the conveying part 11, working part 12 and accommodating part 13, so that the cutting of the wiring boards 3 is performed organically. The central processing unit 101 is a control part that forms the basis of the operating part. The ROM 102 is a memory part in which the basic programs of the cutting steps of the manufacturing apparatus S of the present invention are stored.

The RAM 103 is a memory part in which data and the like are stored; if the set conditions change, this data can be rewritten from an operating panel or the like. The display part 104 is the screen of a CRT or the like; this display part displays the contents of programs and data. The control parts of the individual devices are organically connected [to this display part], and the actuators of the respective devices are operated [using said display part]

The control part 105 is a control part which is used to control the conveying operation of the conveying part, the control part 106 is a control part which is used to control the working operation of the working part, and the control part 107 is a control part which is used to control the accommodating operation of the accommodating part. Furthermore, the other control part 108 is a control part which is used to control the operation of (for example) other conveying bodies and the like. The outline construction of the control system of the manufacturing apparatus of the present invention is as described above.

For example, in cases where the speeds of the conveying devices, rotary tools or the like are altered, or in cases where the set positions are altered, such alterations can be made while viewing the screen of the abovementioned display device 104. Next, the individual devices will be described in detail.

[Conveying Part 11]

The wiring boards 3 that are inserted from the outside of the apparatus are positioned in specified positions and conveyed by the loader 41a of the first conveying device 41 with the surface on which the solder balls 7 are disposed facing upward. This first conveying device 41 also acts as an accommodating compartment, and accommodates a plurality of wiring boards 3. At the time of cutting, the wiring boards 3 are conveyed one at a time toward the cutting devices by the loader 41a. The loader 41 performs a two-dimensional operation in the vertical direction and the conveying direction.

The position of this loader 41 is regulated and guided by a linear guide (not shown in the figures) installed on the base. This linear guide is an ordinary commercially marketed linear guide; accordingly, a description of this linear guide is omitted here. Furthermore, when wiring boards 3 are inserted, this loader 41a moves in order to push the wiring boards 3 out.

[Working Part 12]

This working part 12 is constructed from a first CCD camera 20 and a second CCD camera 30 which are used to position the conveyed wiring boards 3 on the carrying table 21, a first cutting device 23 and second cutting device 33 for the fastened wiring boards 3, second conveying devices 42 and 43 which convey the wiring boards 3 from the first cutting device 23 to the second cutting device 33, position the wiring boards 3 and fasten the wiring boards 3, dust collectors 24 and 34 which capture the dust generated by the first cutting device 23 and second cutting device 33, a cleaning device 70 which cleans the product wiring boards 3b cut by the second cutting device 33, and the like.

a. Carrying Tables 21 and 22

Figure 7:
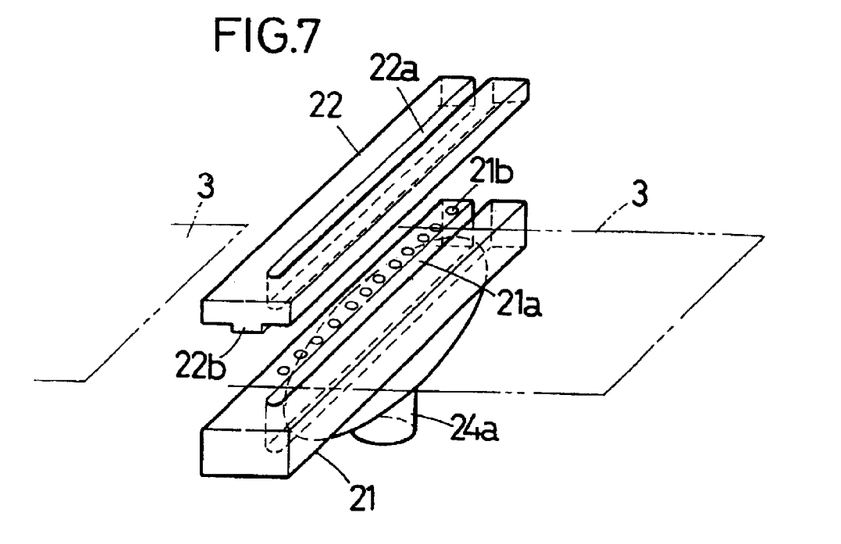
FIG. 7 is a perspective view which shows the relationship between the carrying table and restraining member of the first fastening device.
Figure 9:
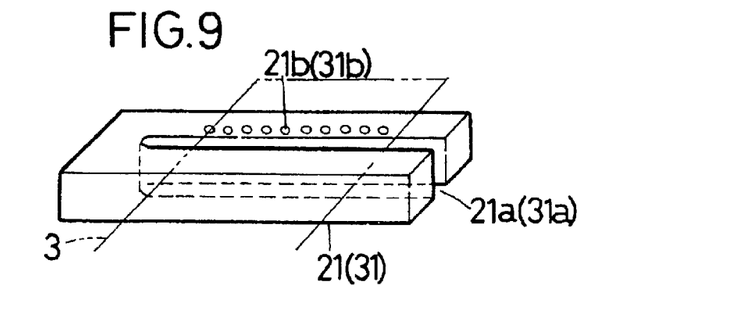
FIG. 9 is a perspective view which shows the small hole parts in the carrying table.

The carrying tables 21 and 22 will be described mainly with reference to FIGS. 7 and 9, with reference also being made to FIGS. 4 and 5. The conveyed wiring boards 3 are placed on the carrying table 21. This carrying table 21 has a shape that is long in the longitudinal direction. A cutting groove 21a is formed in the central part of the carrying table 21, and this cutting groove 21a passes entirely through the carrying table 21 from top to bottom. This cutting groove 21a is a groove which is used to allow the passage of a rotary cutting grindstone 63. A hose 24a which is used to trap dust generated during cutting is connected to the bottom of this cutting groove 21a.

A dust collector 24 is disposed on the tip of this hose 24a. Accordingly, dust-form cutting debris which is generated beneath the carrying table 21 during cutting is sucked into the dust collector 24 via the hose 24a and recovered. Furthermore, around the cutting groove 21a of the carrying table 21, a plurality of small holes 21b are formed along the groove so that these small holes pass through the carrying table 21. These small holes 21b are used to hold the wiring board 3 on the carrying table 21 by means of suction; the wiring board 3 is held on the carrying table 21 by the suction force of the dust collector 24 via these small holes 21b.

In this case, since the dust generated during cutting is simultaneously sucked in, the suction force that holds the wiring board 3 on the carrying table 21 via the small holes 21b is not a strong force, and is used in a supplementary capacity. In order to provide a stable fastening function, suction fastening is accomplished by a special device that is independent of the dust collector 24. If the wiring boards 3 are relatively large and heavy, such a holding method using suction force is unnecessary. Such a method is effective in cases where the wiring boards 3 are small and light.

Before being placed on this carrying table 21, the wiring boards 3 pass beneath the recognition device, i.e., the first CCD camera 20. The first CCD camera 20 graphically recognizes the positions of the solder balls 7 on the wiring boards 3, or recognizes the first cutting position marks 4 formed on the wiring boards 3 beforehand, and specifies the positions.

Since the positional relationship of the first CCD camera 20 and carrying table 21 is fixed, accurate positioning with respect to the cutting tool is accomplished by operational processing when said wiring boards 3 are placed on the carrying table 21. Next, the accurately placed wiring boards 3 are fastened in place by the restraining member 22 which is waiting above. This restraining member 22 has a construction similar to that of the carrying table 21 to which the wiring boards 3 are fastened, and clamps said wiring boards 3 between said restraining member 22 and the carrying table 21.

Specifically, the restraining member 22 is lowered toward the wiring board 3 that is placed on the carrying table 21, so that the wiring board 3 is clamped between the restraining member 22 and the carrying table 21. A cutting groove 22a is also formed in this restraining member 22 as in the aforementioned carrying table 21, so that a cutting tool can pass through. A projecting part 22b is disposed on the undersurface of this restraining member 22. This projecting part 22b prevents charging or the passage of electric current, and is made of rubber, a synthetic resin that possesses elasticity, or the like. This projecting part 22b is fastened to the lower part of the restraining member 22 by a method such as bonding or the like.

As a result of this projecting part 22b, warping of the wiring boards 3 at the time of fastening is prevented; furthermore, the scattering of dust-form cutting debris into the surrounding areas is also prevented.

b. First Cutting Device 23 and Dust Collector 24

The first cutting device 23 will be described mainly with reference to FIGS. 10, 11, 13 and 14, with reference also being made to FIGS. 4 and 5. After a wiring board 3 has been clamped and fastened in place by the restraining member 22, [this wiring board 3] is cut by the first cutting device 23. This first cutting device 23 will be described with reference to FIG. 10. The base 60 of the first cutting device 23 is fastened to the end part of the first conveying device 41. A guide is formed on the upper part of this base 60 so that the saddle 61 of the first cutting device 23 straddles [this guide] and is guided in a manner that allows said saddle to advance and retract in the vertical direction (Y).

Figure 10:
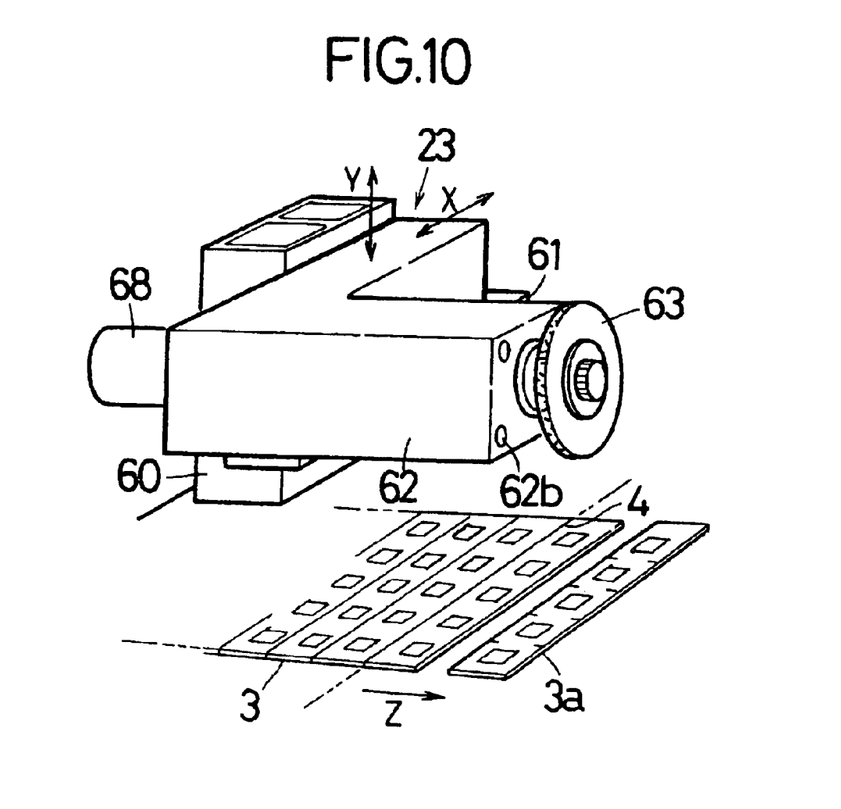
FIG. 10 is a perspective view which illustrates the first cutting device.

A guide part (not shown in the figures) is also disposed on the side surface of this saddle 61, and a head part 62 straddles this guide part and is guided so that said head part 62 can advance and retract in the feeding direction (X). Accordingly, the head 62 in the present embodiment can move in two axial directions, i.e., along the X axis and Y axis. The wiring boards 3 are fed one row at a time parallel to the direction of the Z axis. After the first cutting positions marks 4 have been recognized by the first CCD camera 20 so that the position of each wiring board 3 has been specified, and said wiring board 3 has been fastened to the carrying table 21, the wiring board 3 is cut by the movement of the head 62 in the directions of the X axis and Y axis.

Furthermore, the guidance of this head 62 in the direction of the X axis is accomplished by means of a linear bearing (not shown in the figures). The same is true of the guidance of the saddle 61 in the direction of the Y axis relative to the base 60. By using linear bearings, it is possible to achieve smooth guidance of the operation with a light load. In the present embodiment, two axial directions are used, i.e., the directions of the X axis and Y axis; however, a structure in which movement is possible in three axial directions, i.e., along the X axis, Y axis and Z axis, may also be used. Furthermore, the driving bodies used for these guidance operations are not shown in the figures; however, these driving bodies are servo motors or the like, and guided driving is accomplished via ball screws.

Figure 11:
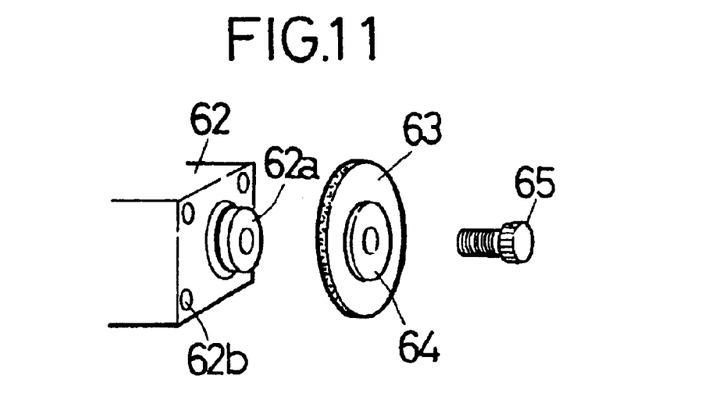
FIG. 11 is a perspective view which shows the state of attachment of the rotary tool to the head of the cutting device.

A rotary cutting grindstone 63 is built into the abovementioned head 62 so that this grindstone 63 is free to rotate. This rotary cutting grindstone 63 is ordinarily a disk-form diamond grindstone, and is supported on a spindle 62a. This spindle 62a is supported on the head 62, and is rotated at a high speed. In the present embodiment, the external shape of the head 62 is an angular shape.

Ventilation holes 62b that pass through the head 62 are disposed in the four corners of the head 62. This construction is arranged so that dust generated during cutting can be sucked in via these ventilation holes 62b. The dust that has thus been sucked in is recovered in the dust collector 24. The external shape of the abovementioned head 62 is an angular shape; however, in cases where this head is formed with a cylindrical shape, the parts corresponding to the ventilation holes 62b may be formed as pipes. In cases where such pipes are used, these pipes may be supported by installing an angular partition cover on the front part of the head 62. If this is done, the same effect as that obtained in a case where the head 62 is formed with an angular shape can be obtained. The use of an angular shape makes it possible to obtain a construction that is easy to cool; furthermore, other devices can also be attached to this head 62.

Furthermore, the rotary cutting grindstone 63 is bolt-fastened to the spindle 62a via a flange 64 by means of a bolt 65. Moreover, a tool cover 66 is installed on the head 62 so that this tool cover 66 covers the cutting range around the cutting tool (see FIG. 13). The dust that is enclosed inside this tool cover 66 is recovered in the dust collector 24 via the ventilation holes 62b.

Furthermore, as a result of the rotary cutting grindstone 63 being caused to rotate with the blade of the rotary cutting grindstone 63 facing downward, the cutting operation is devised so that the cutting debris is conducted downward, with no cutting debris allowed to escape upward. Furthermore, there is a danger that cutting debris will be pulled upward when the tool is retracted upward; accordingly, in order to avoid this, the tool is smoothly retracted in the cutting state. However, if conditions are suitable so that the tool can be retracted after being freed in the upward direction, such an operation results in a shorter retraction time.

Figure 13:
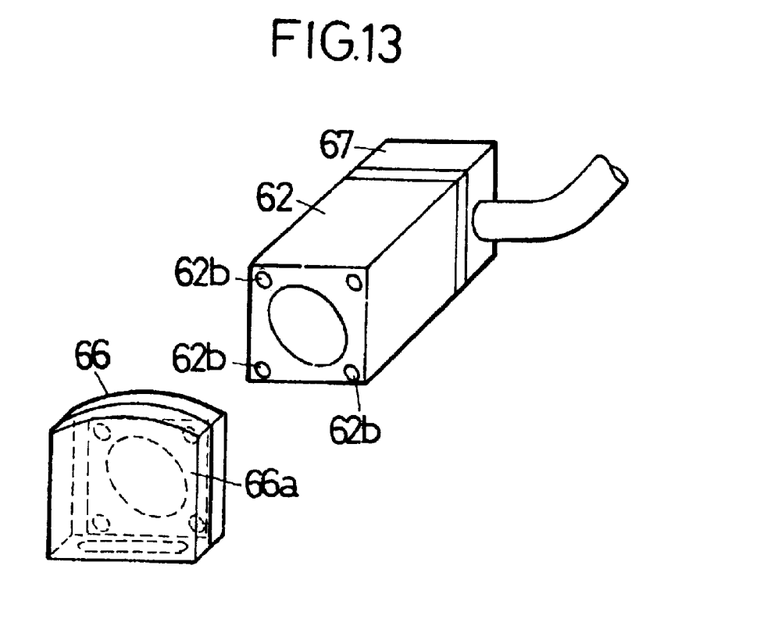
FIG. 13 is a perspective view which shows the state of attachment of the cover to the head of the cutting device.
Figure 14:
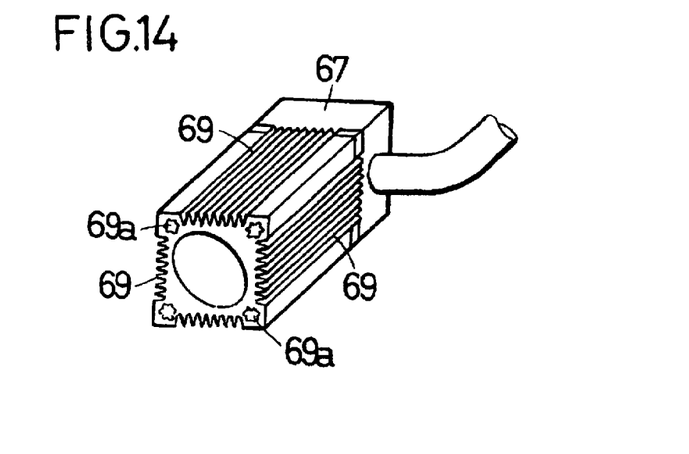
FIG. 14 is a perspective view which shows the construction of fins for the head of the cutting device.

As is shown in FIG. 13, a connecting box 68 is attached to the rear end of the head 62, and a motor 68 is attached to this connecting box 67 (see FIG. 10). A belt, coupling or the like which constitutes the means of connection with the motor 68 is contained inside the connecting box 67. Furthermore, if cooling fins 69 are disposed on the exterior of the head 62, this is effective in cooling the head 62. Moreover, a similar effect can be obtained by forming the ventilation holes 62b with fin shapes, so that these ventilation holes have a star shape 69a (see FIG. 14).

c. Second Conveying Devices that Perform Conveying, Positioning and Fastening

Figure 8:
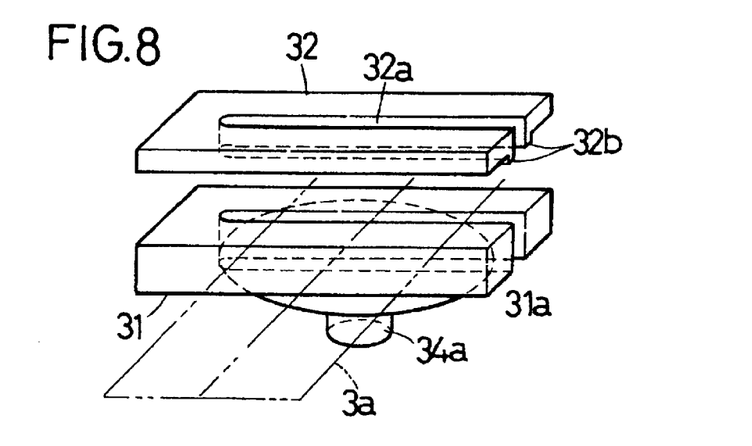
FIG. 8 is a perspective view which shows the relationship between the carrying table and restraining member of the second fastening device.

These devices will be described mainly with reference to FIG. 8, with reference also being made to FIGS. 4 and 5. The cut wiring boards 3a that have been cut by the first cutting device 23 are released from the fastened state and transferred to the second conveying devices 42 and 43. These second conveying devices 42 and 43 also have basically the same construction as the first conveying device 41. The cut wiring boards 3a are long, slender strip-form parts in which IC packages are arranged in rows.

The conveying to the second cutting device 33 is performed with the cut wiring boards 3a vacuum-chucked by a robot 42a. The operation of this robot 42a is biaxial in the vertical direction and feeding direction. The cut wiring boards 3a are chucked and lifted upward, and are transferred to the carrying table 31 of the second cutting device 33.

In the present embodiment, two cut wiring boards 3a are placed on the carrying table 31 from the second conveying device 43. Prior to being placed, the cut wiring boards 3a pass the second CCD camera 30 which constitutes the second recognition device, so that the cutting positions are recognized. This recognition method is similar to that described above; the second cutting position marks 5 are recognized, and operational processing is performed so that the accurate cutting positions are specified.

The method used to accomplish fastening in the accurate positions is the same as the method used for clamping on the carrying table 21 by the restraining member 22. However, the orientation of the carrying table 31 is changed by 90 degrees relative to the orientation of the carrying table 21. When the two cut wiring boards 3a are inserted into the carrying table 31 along the direction of length of the strip-form cut wiring boards 3a, and are positioned, a restraining member 32 advances and clamps the cut wiring boards 3a.

The part located in front of this carrying table 31 forms a temporary carrying table 31a. The reason for this is that since the carrying table 31 is a long, slender device with a narrow width, the cut wiring boards 3a cannot be carried by the carrying table 31 alone in cases where these cut wiring boards 3a are large. Accordingly, [this temporary carrying table 31a] is provided in order to support the cut wiring boards 3a. As in the case of the carrying table 21, one end of a hose 34a used for dust suction is fastened to the lower part of the carrying table 31, and the cutting debris that is generated during cutting is recovered by a dust collector 34 via the hose 34a.

This dust collector 34 is identical to the dust collector 24 which recovers the cutting debris generated by the first cutting device 23; both of these dust collectors recover the cutting debris that is generated during the two cutting operations. Since small holes 21b (31b) are formed in the carrying table 21 [(31)], the cut wiring boards 3a are held on the carrying table 31 by a suction force in the same manner as described above.

d. Second Cutting Device 33

Figure 12:
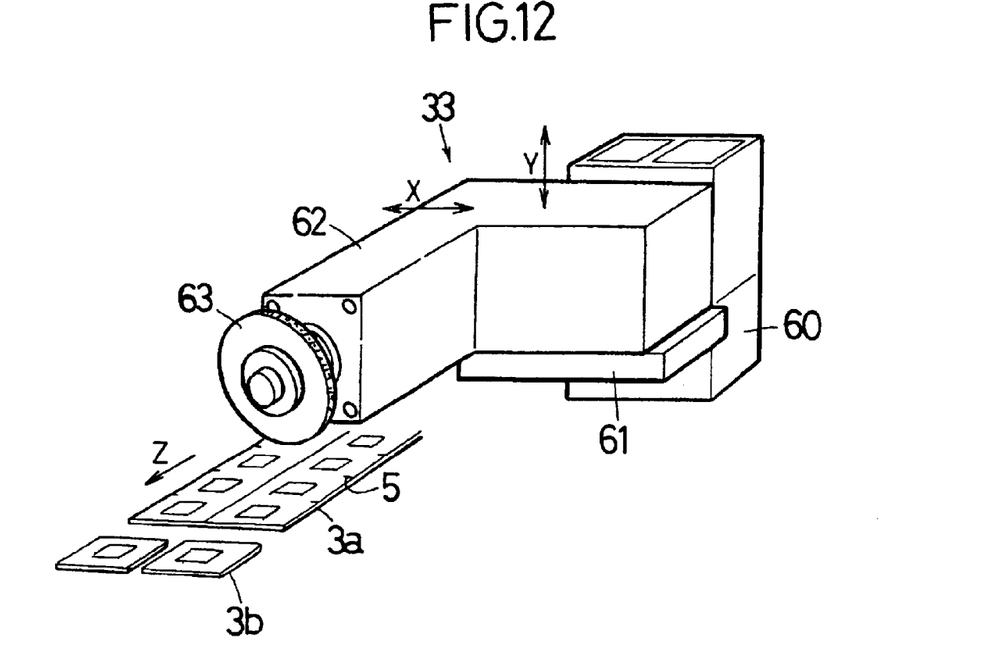
FIG. 12 is a perspective view which shows the second cutting device.

The second cutting device 33 will be described mainly with reference to FIG. 12, with reference also being made to FIGS. 4 and 5. When the cut wiring boards 3a are fastened to the carrying table 31 by the restraining member 32, the two inserted cut wiring boards 3a are simultaneously cut by the second cutting device 33. This second cutting device 33 is disposed so that the orientation of said second cutting device 33 differs by 90 degrees from the orientation of the first cutting device 23; however, the basic construction of the second cutting device 33 is identical to that of the first cutting device 23.

During cutting, the rotary cutting grindstone 63 cuts the cut wiring boards 3a while passing through the aforementioned cutting grooves 21a, 32a along the length of said grooves. When cutting is completed, the head 62 is retracted upward and returns to its original position. When the fastening of the cut wiring boards 3a is released by the restraining member 32, the cut wiring boards 3a are pushed out in the forward direction by the second conveying device 43. In the present embodiment, a method has been described in which the cut wiring boards 3a are positioned in the direction of the plane and cut; however, the cut wiring boards 3a may also be positioned in the vertical direction, and moved and cut in the vertical direction.

Cutting is thus repeated so that the cut wiring boards 3a are separated, and are finally cut as wiring boards 3b which constitute the original forms of the IC packages. When cutting is performed by this second cutting device 33 as well, the cutting is repeated in the same manner as in the case of the first cutting device 23, and cutting is performed with the two cutting devices operating simultaneously. As a result of the two cutting devices thus operating simultaneously, the manufacturing time involved in cutting can be greatly reduced.

e. Cleaning Device 70

Figure 15:
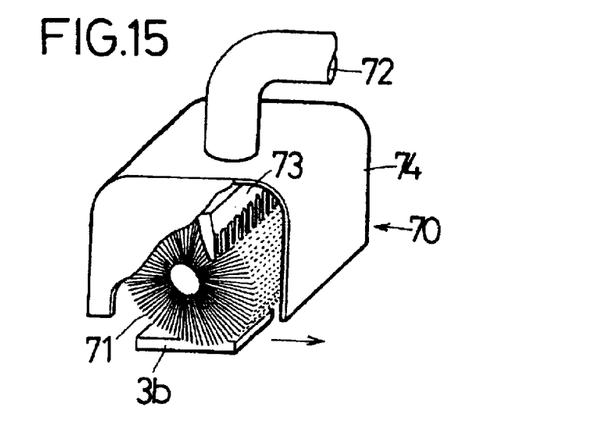
FIG. 15 is a perspective view which shows the cleaning device.

The cleaning device 70 will be described mainly with reference to FIGS. 15, 16 and 17, with reference also being made to FIGS. 4 and 5. To outline the cleaning device 70, this device is constructed from a brush 71, a dust-collecting hose 72, a scraper 73 and a cover 74. The brush 71 has a cylindrical shape, with fine bristles arranged in the radial direction. Since the object of cleaning consists of wire boards 3b, the brush 71 is made of a soft material; the wiring boards 3b are brushed by the rotation of the brush 71 so that dust adhering to the wiring boards 3b is removed.

The scraper 73 is a comb-form (fork-form) part, and contacts the aforementioned brush 71 via a ground wire, so that any charge on the brush 71 caused by static electricity is removed. A cover 74 is provided which covers this brush 71 and scraper 73, and the aforementioned dust-collecting hose 72 is attached to one end of this cover 74. This dust-collecting hose 72 is used to recover dust in the dust collector 34 following cleaning.

Figure 16:
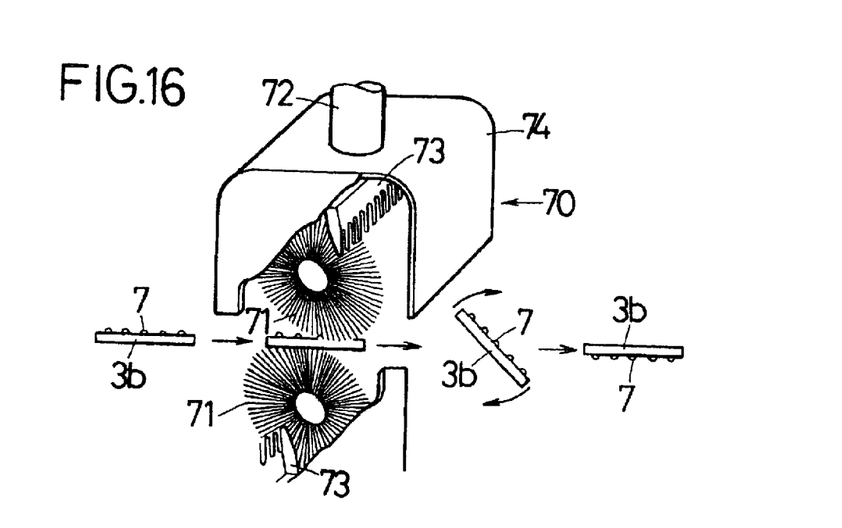
FIG. 16 is a perspective view which shows the disposition of a pair of brushes facing each other, and the passage of the wiring board [between said brushes]
Figures 17A, 17B:
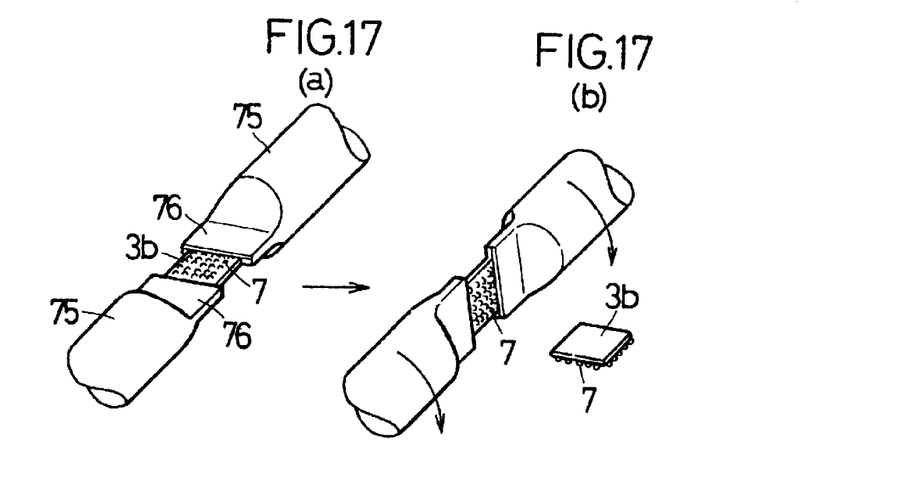
FIG. 17(a) is a perspective view which shows the construction that clamps the wiring board.
FIG. 17(b) is a perspective view which shows the inversion of the clamping members of the construction shown in FIG. 17(a)

The cleaning device 70 shown in FIG. 16 has a construction in which two brushes 71 of such a construction are installed as a set with said brushes 71 facing each other. This cleaning device 70 is not absolutely necessary. If dust or the like is completely removed in the cutting process so that there is no danger that such dust or the like will adhere to the wiring boards 3, this step may be omitted.

In combination with the cleaning device 70, clamping members 75 are provided which are used to clamp the wiring boards 3b cut by the second cutting device 33. These clamping members are rod-form members, and two clamping members 75 are disposed facing each other so that these clamping members 75 can advance and retract in synchronization with each other. The clamping members 75 rotate while acting in conjunction. The tip end portions of these clamping members 75 have flat shapes 76, and claw parts which are V-shaped grooves are further formed in the tip ends of these flat shapes 76. These two mutually facing claw parts are caused to advance and retract in synchronization with each other by a pair of cylinders.

The wiring boards 3b that are cut and conveyed have a substantially rectangular shape. The claw parts of the clamping members 75 are arranged so that these claw parts face each other and clamp the end parts of the substantially rectangular wiring boards 3b. These wiring boards 3b are clamped one at a time by the claw parts of the clamping members 75. With the wiring boards 3b in a clamped state, these clamping members 75 are passed between the two facing brushes 71. In this case, the top surface and undersurface of each wiring board 3b are simultaneously brushed. In this brushing step, both facing clamping members 75 are caused to undergo a half-rotation of 180 degrees, so that the orientation of the top surface and undersurface of each wiring board 3b is reversed.

As a result, the surface on which the solder balls 7 are disposed is caused to face downward. As a result of the wiring boards 3b thus being inverted during the conveying process, time is saved compared to a case in which the products placed in a fixed position are subsequently inverted as in conventional methods. Furthermore, the above process was described in terms of a single unit wiring board 3b; however, it goes without saying that the processing time can be shortened if a plurality of wiring boards 3b are processed using the same mechanism.

[Product Accommodating Box 81]

This is a device which accommodates the wiring boards 3b for which the aforementioned cleaning has been completed as IC package products. Although this is not shown in the figures, the clamping of the wiring boards 3b by the clamping members 75 is released, and the wiring boards 3b are accommodated in the product accommodating box 81 in an orderly fashion by an accommodating conveying device 80. This conveying is accomplished by a three-dimensional operation performed by the robot of the accommodating conveying device 80. A plurality of product accommodating boxes 81 are prepared, and when one accommodating box is filled, this box is conveyed to the outside; the next product accommodating box is then placed in a specified position, and the same work is continued.

The present invention is constructed as described above; next, the operation of the present invention will be described. A wiring board 3 which has been conveyed with the surfaces on which the solder balls 7 are disposed facing upward is placed on the carrying table 21 after the first cutting position marks 4 which indicate the cutting position have been recognized by the first CCD camera 20. Next, the restraining member 22 which is waiting above is lowered so that the wiring board 3 is fastened in place. This fastening is accomplished by the projecting part on the lower part of the restraining member 22.

After this fastening is completed, the first cutting device 23 passes through the cutting grooves in the carrying table 21 and restraining member, and cuts the wiring board 3, so that long, slender strip-form cut wiring boards 3a are cut out. Without any change in orientation, the cut wiring boards 3a that have been cut out are positioned on the carrying table 31 of the second cutting device 33 after the second cutting position marks 5 have been recognized by the second CCD camera 30.

Then, the restraining member 32 is lowered so that the cut wiring boards 3a are fastened in place. Following this fastening, the cut wiring boards 3a are cut by the second cutting device 33. This cutting is performed simultaneously on two strips that are sent together. The cut wiring boards 3b are clamped by the rod-form clamping members 75 and caused to pass through the cleaning device. The wiring boards 3b are turned upside down in this conveying step. Then, the wiring boards 3b that have been cleaned and had the surfaces on which the solder balls 7 are disposed turned to face downward are accommodated in the product accommodating box as the [final] products.

[Other Embodiments]
[Rotary Cutting Grindstone 63]

In the cutting devices of the abovementioned embodiment, the rotary cutting grindstones 63 were described as disk-form diamond tools. However, CBN (cubic boron nitride) grindstones may also be used; such grindstones are widely used as cutting grindstones. Since such CBN grindstones are universally known, a description of properties and the like will be omitted here. Such CBN grindstones or borazone grindstones are effective in the following respects.

Specifically, in the wiring boards 3 that are the object of cutting, whose material may be referred to as a resin, hard compounds such as silicon oxide or the like are admixed in a thermosetting synthetic resin such as an epoxy resin or the like. Furthermore, a relatively soft metal such as copper or the like is used as the wiring material. In cases where such materials are cut with a diamond tool, the resin portions are readily cut so there is no problem in this regard.

However, when the aforementioned soft metal portions are cut, the tip end portions of the diamond blade form an obtuse angle, and since cutting is performed by high-speed rotation, the blade is burned by the extreme heat so that blade becomes rounded. As a result, the cutting resistance increases, and since soft metals such as copper or the like have a low melting point, there is danger that such soft metals will fuse to the abrasive grains of the diamond grindstone so that cutting becomes impossible.

Borazone grindstones have a lower hardness than diamond grindstones; [in the case of borazone grindstones,] however, when the limit to grinding (cutting) state is reached, some of the abrasive grains undergo self-destruction and are separated, so that these abrasive grains are replaced by fresh abrasive grains. Accordingly, the blade is constantly metabolized so that the grinding properties are maintained. Such separation of the abrasive grains occurs under appropriate conditions so that there is no wearing away of the grindstone.

Figures 18A, 18B:
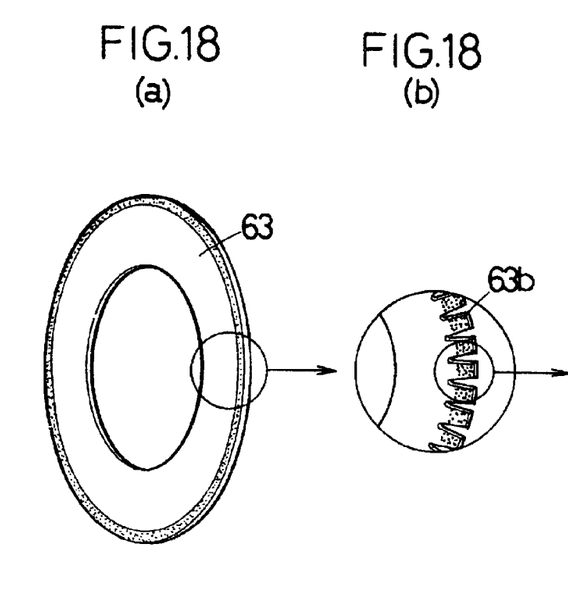
FIG. 18(a) is a perspective view of the tool overall.
FIG. 18(b) is a partial enlarged view of FIG. 18(a)
Figure 18C:
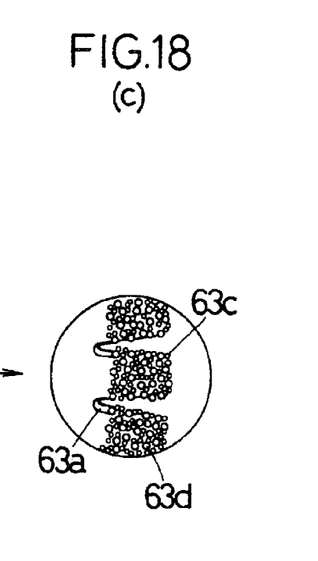
FIG. 18(c) is a partial enlarged view of FIG. 18(b)

As a result, if the wiring boards 3 meet these conditions, a constant cutting state can be maintained, so that clogging by soft metals can be reduced, thus improving the quality [of the product] Considering the advantages of diamond grindstones and borazone grindstones, construction as a composite grindstone is also possible. FIG. 18 shows an example of a composite grindstone. In this figure, FIG. 18(*b*) is a partial enlarged view of FIG. 18(*a*), and FIG. 18(*c*) is a partial enlarged view of FIG. 18(*b*).

This grindstone has a construction in which cut-outs (valley parts) 63*a* are formed in the manner of a gear in portions of the blade of a rotary cutting grindstone 63. Diamond abrasive grains 63*c* and CBN abrasive grains 63*d* are electro-deposited by electroplating on the peak parts 63*b* of this blade. The proportions of the diamond abrasive grains 63*c* and CBN abrasive grains, and the sizes of the respective abrasive grains 63*d*, are determined by experience.

In the present embodiment, the proportion of CBN abrasive grains 63*d* was set in the range of 30 to 70%, and the size of the CBN abrasive grains was set at 1 to 2 times the size of the diamond abrasive grains; furthermore, the concentration (disperse density) of the abrasive grains was lowered. As a result, the aforementioned problems were eliminated. Especially in the cutting of soft metals, copper or the like that was fused to the abrasive grains 63*c* during cutting was pushed from the peak parts 63*b* of the grindstone into the cut-out parts (valley parts) 63*a* as cutting progressed, and this metal was separated from the grindstone when said metal reached the valley areas.

In order to heighten this effect, it is desirable that the peak parts 63*b* be as narrow as possible within the range permitted by strength considerations. When the thickness of the rotary cutting grindstone 63 is large, cutting tends to be accompanied by the generation of heat. On the other hand, when this thickness is small, limits are generated by considerations of strength, and cracking tends to occur. This thickness should be set at the optimal value in accordance with the conditions of the wiring boards that are to be cut.

[Merits of the Invention]

In the present invention, as was described above in detail, a series of cutting operations in which cutting is simultaneously performed by two cutting devices are concentrated in a single apparatus, and peripheral devices are attached so that a compact structure is obtained. Accordingly, economical and highly efficient manufacturing is possible.

Furthermore, the conventional step of bonding to a film or the like and working in this state is made unnecessary. As a result, a great reduction in the amount of work required for manufacture is achieved. Moreover, since cleaning by means of water is not performed, the need to treat cleaning water containing copper or the like in consideration of the environment is eliminated.

Furthermore, the cutting tools used are tools that tend not to become clogged; accordingly, a long-term stable cutting operation is possible, and products with a uniform quality can be manufactured.

What is claimed is:

1. A method for manufacturing electronic parts comprising:

a conveying step wherein plate-form electronic parts sealed in resin are conveyed;

a first fastening step wherein conveyed said plate-form electronic parts are positioned and fastened in place;

a first cutting step wherein said plate-form electronic parts that have been positioned and fastened in place in said first fastening step are moved in one direction on the plane that includes said plate-form electronic parts, and are cut;

a second fastening step wherein rectangular-form electronic parts that have been cut in said first cutting step are conveyed, positioned and fastened in place;

a second cutting step wherein said rectangular-form electronic parts that have been conveyed, positioned and fastened in place in said second fastening step are moved in a direction that crosses the abovementioned cutting direction, and are cut; and a product accommodating step wherein single electronic parts that have been cut in said second cutting step are accommodated.

2. The method for manufacturing electronic parts according to claim 1, wherein said first fastening step and said second fastening step include a position recognition step wherein the positions of said rectangular-form electronic parts or said rectangular-form electronic parts that have been conveyed are optically recognized.

3. The method for manufacturing electronic parts according to claim 1 or claim 2, wherein said first fastening step and said second fastening step are press-fastening steps wherein said plate-form electronic parts or said rectangular-form electronic parts are fastened in place by the application of pressure from above after said electronic parts have been placed on a carrying table.

4. The method for manufacturing electronic parts according to claim 1 or claim 2, wherein said first cutting step and said second cutting step are steps wherein cutting is performed by causing a rotary abrasive wheel to move.

5. The method for manufacturing electronic parts according to claim 1 or claim 2, wherein said first cutting step and said second cutting step include a step wherein dust or the like generated by cutting is removed by suction.

6. The method for manufacturing electronic parts according to claim 1 or claim 2, wherein said product accommodating step includes a step wherein said single electronic parts cut in said second cutting step are clamped and inverted, and the orientation of said single electronic parts is altered.

7. The method for manufacturing electronic parts according to claim 1 or claim 2, wherein said product accommodating step includes a step wherein clamped said single electronic parts are brushed.

\* \* \* \* \*